US008970214B2

(12) United States Patent
Tamura et al.

(10) Patent No.: US 8,970,214 B2
(45) Date of Patent: Mar. 3, 2015

(54) CURRENT SENSOR

(71) Applicant: Alps Green Devices Co., Ltd., Tokyo (JP)

(72) Inventors: Manabu Tamura, Miyagi-ken (JP); Masatoshi Nomura, Miyagi-ken (JP); Hiroyuki Hebiguchi, Miyagi-ken (JP)

(73) Assignee: ALPS Green Devices Co., Ltd., Tokyo (JP)

( * ) Notice: Subject to any disclaimer, the term of this patent is extended or adjusted under 35 U.S.C. 154(b) by 310 days.

(21) Appl. No.: 13/665,624

(22) Filed: Oct. 31, 2012

(65) Prior Publication Data

US 2013/0057275 A1    Mar. 7, 2013

Related U.S. Application Data

(63) Continuation of application No. PCT/JP2011/059449, filed on Apr. 15, 2011.

(30) Foreign Application Priority Data

Jul. 7, 2010    (JP) .................................. 2010-154496

(51) Int. Cl.
  *G01R 33/09*    (2006.01)
  *G01R 15/20*    (2006.01)
  *B60L 3/00*    (2006.01)
  *B60L 11/18*    (2006.01)
  *G01R 1/20*    (2006.01)
  *G01R 19/00*    (2006.01)

(52) U.S. Cl.
  CPC ............. *G01R 15/207* (2013.01); *B60L 3/0038* (2013.01); *B60L 11/1861* (2013.01); *B60L 2240/549* (2013.01); *G01R 1/203* (2013.01); *G01R 19/0092* (2013.01); *B60L 11/182* (2013.01); *Y02T 10/7088* (2013.01); *Y02T 10/7044* (2013.01); *Y02T 10/7005* (2013.01); *Y02T 10/705* (2013.01); *Y02T 90/14* (2013.01); *Y02T 90/122* (2013.01)
  USPC .......................................... 324/252; 324/244

(58) Field of Classification Search
  CPC ...... G01R 33/09; G01R 33/02; G01R 15/205; H02J 7/025; H02J 5/005
  USPC ................................................. 324/252, 244
  See application file for complete search history.

(56) References Cited

FOREIGN PATENT DOCUMENTS

| JP | 60- 82971 | 5/1985 |
| JP | 7-218552 | 8/1995 |
| JP | 2007-78416 | 3/2007 |
| JP | 2007-198917 | 8/2007 |

OTHER PUBLICATIONS

International Search Report dated Jul. 19, 2011 from International Application No. PCT/JP2011/059449.

*Primary Examiner* — Reena Aurora
(74) *Attorney, Agent, or Firm* — Beyer Law Group LLP

(57) ABSTRACT

A current sensor includes a magnetic balance sensor including a feedback coil that is disposed in the vicinity of a magnetic sensor element whose characteristics are changed by an inducted magnetic field from a current to be measured and generates a cancellation magnetic field for offsetting the inducted magnetic field, a shunt resistant that is connected in series with a current line for circulating the current to be measured, and a switch circuit that switches to magnetic balance detection at the time of a small current and switches to shunt resistance detection at the time of a large current.

5 Claims, 6 Drawing Sheets

CURRENT SENSOR

CLAIM OF PRIORITY

This application is a Continuation of International Application No. PCT/JP2011/059449 filed on Apr. 15, 2011, which claims benefit of Japanese Patent Application No. 2010-154496 filed on Jul. 7, 2010. The entire contents of each application noted above are hereby incorporated by reference.

BACKGROUND OF THE INVENTION

1. Field of the Invention

The present invention relates to a current sensor that has high accuracy and low power consumption over a wide measuring range.

2. Description of the Related Art

For example, the magnitude of a current for driving a motor of an electric vehicle or a hybrid car (combination of electricity and gasoline) is measured by a current sensor. In addition, even in a battery for driving a motor, a battery residual amount is managed by detecting an amount of a current flowing into and out of the battery using the current sensor. A magnetic proportional current sensor and a magnetic balance current sensor may be given as examples of the current sensor. In the magnetic proportional current sensor, a magnetic field proportional to a current to be measured passes through a core gap by a magnetic force line generated within a magnetic core, and the magnetic field is converted into a voltage signal by a magnetic detecting element, thereby generating an output voltage proportional to the current to be measured. Meanwhile, in the magnetic balance current sensor, when the current to be measured flows, an output voltage is generated in the magnetic detecting element by a magnetic field corresponding to the current, and a voltage signal output from the magnetic detecting element is converted into a current to thereby be fed back to a feedback coil. As for the magnetic balance current sensor, the magnetic field (a cancellation magnetic field) generated by the feedback coil and the magnetic field generated by the current to be measured are canceled out from each other, and therefore the magnetic balance current sensor is operated so that the magnetic field is always zero. In this instance, a feedback current flowing in the feedback coil is subjected to voltage-conversion to thereby obtain the voltage-converted current as an output.

As the magnetic detecting element in the current sensor, a magnetoresistance effect element such as a Hall element or a giant magneto resistance (GMR) element may be used. In the magnetic proportional current sensor using a Hall element as the magnetic detecting element, in a case in which a measurement range is widened, resolution is decreased when the current to be measured is small. In the magnetic balance current sensor using the Hall element as the magnetic detecting element, a magnetic field due to a large current cannot be canceled. Therefore, in Japanese Unexamined Patent Application Publication No-2007-78416 as a method for compensating the both problems, a method, in which the magnetic proportional current sensor using the Hall element and the magnetic balance current sensor using the Hall element are disposed, and these are switched to be used according to the magnitude of the current to be measured, is disclosed.

However, in the magnetic current sensor such as the magnetic balance current sensor or the magnetic proportional current sensor, a measurement range is limited by various conditions such as magnetic saturation, a power supply voltage. Therefore, when the current to be measured is measured using the magnetic current sensor, the use of the magnetic current sensor is limited within the measurement range. In the technology disclosed in Japanese Unexamined Patent Application Publication No-2007-78416, the magnetic proportional current sensor is used in a large current area, but the use of the magnetic proportional current sensor is limited to a range that is not magnetically saturated, and therefore the measurement range cannot be widened. In addition, in the technology disclosed in Japanese Unexamined Patent Application Publication No-2007-78416, two types of current sensors should be separately prepared. Therefore, space saving cannot be achieved and a manufacturing process becomes complex.

SUMMARY OF THE INVENTION

The present invention provides a current sensor that performs measurement with high accuracy at a low current while widening a measurement range, and achieves space saving.

According to an aspect of the invention, there is provided a current sensor including: a magnetic sensor whose characteristics are changed by an inducted magnetic field from a current to be measured; a shunt resistor that is connected in series with a current line for circulating the current to be measured; and a switching unit that switches to magnetic detection in which an output voltage of the magnetic sensor is used as a sensor output at the time of a small current, and switches to shunt resistance detection in which a voltage difference of the shunt resistor is used as a sensor output at the time of a large current.

By this configuration, measurement may be performed with high accuracy by the magnetic detection at the time of the small current, and a measurement range may be widened by the shunt resistance detection at the time of the large current. In addition, in a single current sensor, the magnetic detection and the shunt resistance detection may be switched, and therefore space saving may be achieved.

In the current sensor of the invention, it is preferable that the switching unit obtains a threshold value within a range in which linearity is obtained due to output characteristics of the magnetic sensor, switches in a case where a magnitude of the current to be measured is smaller than the threshold value as the time of the small current to the magnetic detection, and switches in a case where the magnitude thereof is larger than the threshold value to the shunt resistance detection as the time of the large current.

By this configuration, measurement accuracy may be improved within the range in which linearity is obtained due to output characteristics of the magnetic sensor while the measurement range is widened.

In the current sensor of the invention, it is preferable that the magnetic sensor be provided in the shunt resistor through an insulating substrate. By this configuration, a resistance value of the shunt resistor is set as being low so that the large current can be measured, and therefore the current to be measured flowing in the shunt resistor may be detected by the magnetic sensor at the time of the small current.

In the current sensor of the invention, it is preferable that the magnetic sensor be a magnetic balance sensor including a magnetic sensor element whose characteristics are changed by the inducted magnetic field from the current to be measured, and a feedback coil that is disposed in the vicinity of the magnetic sensor element and generates a cancellation magnetic field for offsetting the inducted magnetic field. By this configuration, measurement may be performed with high accuracy at the time of the small current, and therefore the current sensor with a wide measurement range may be provided.

In the current sensor of the invention, it is preferable that the magnetic sensor be a magnetic proportional sensor including a magnetic sensor element whose characteristics are changed by the inducted magnetic field from the current to be measured. By this configuration, the measurement may be performed with low power consumption at the time of the small current, and therefore the current sensor with a wide measurement range may be provided.

According to an embodiment of the invention, the current sensor includes a magnetic sensor whose characteristics are changed by an inducted magnetic field from a current to be measured, a shunt resistor that is connected in series with a current line for circulating the current to be measured, and a switching unit that switches to magnetic detection in which an output voltage of the magnetic sensor is used as a sensor output at the time of a small current and switches to shunt resistance detection in which a voltage difference of the shunt resistor is used as a sensor output at the time of a large current, and therefore magnetic detection and shunt resistance detection may be performed in a single current sensor. Therefore, measurement may be performed with high accuracy at the time of a lower current while widening a measurement range, and space saving may be achieved.

DESCRIPTION OF THE PREFERRED EMBODIMENTS

Figure 1:
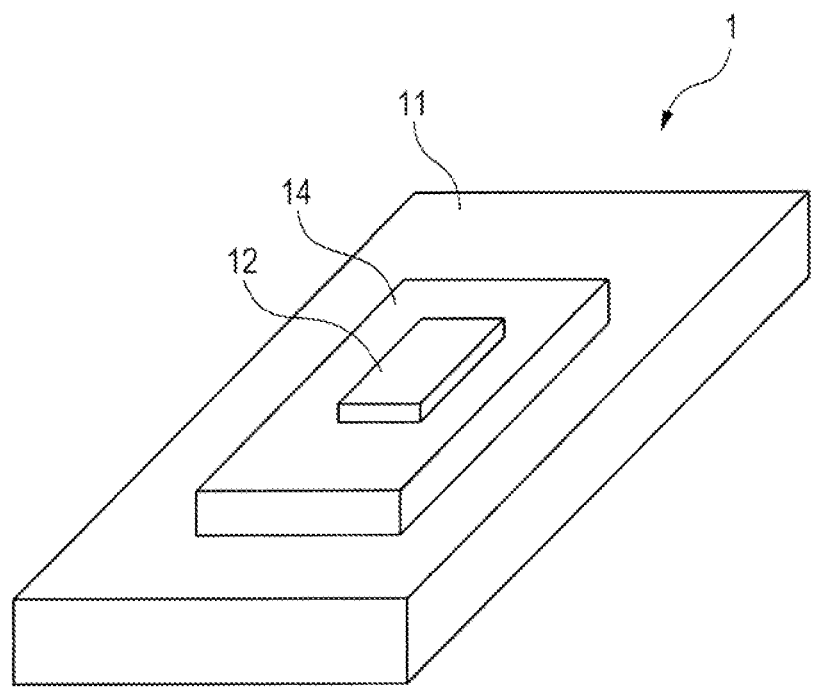
FIG. 1 is a drawing showing a current sensor according to a first embodiment of the invention.

A magnetic proportional current sensor may measure a relatively small current to be measured with high accuracy using low power consumption. However, when the current to be measured is large, a magnetic core is magnetically saturated by a magnetic field of the large current to be measured, an output value thereafter has gone wrong, and the magnetic proportional current is not available, and a dynamic range of the current to be measured becomes narrower. Meanwhile, the magnetic balance current sensor has a more complex configuration than that of the magnetic proportional current sensor, but may measure the current to be measured with high accuracy even compared to the magnetic proportional current sensor. However, in the magnetic balance current sensor, when the current to be measured is large, it is possible to widen the dynamic range of the current to be measured since there is an upper limit of a current continuously flowing in a feedback coil according to various conditions such as a power supply voltage and the like.

In order to widen the dynamic range, a method of measuring the current to be measured from a voltage difference of a shunt resistor is considered. In this shunt resistant measurement method, a resistance value of the shunt resistor is set as being small in order to widen the dynamic range. Therefore, the large current to be measured may be detected, but sufficient measurement accuracy cannot be obtained at the time of measuring a small current to be measured.

By focusing on the above-described point by the inventors of the invention, magnetic detection and shunt resistance detection are switched with each other to be used in accordance with the magnitude of the current to be measured, and therefore measurement may be performed with high accuracy at the time of a low current while widening a measurement range, and space saving may be achieved as well. In particular, when measuring a relatively small current, power consumption may be reduced through magnetic proportional detection, and therefore detection may be performed with high accuracy using magnetic balance detection.

That is, according to the invention, the current sensor may include a magnetic sensor whose characteristics are changed by an inducted magnetic field from a current to be measured, a shunt resistor that is connected in series with a current line for circulating the current to be measured, and a switching unit that switches to magnetic detection in which an output voltage of the magnetic sensor is used as a sensor output at the time of a small current, and switches to shunt resistance detection in which a voltage difference of the shunt resistor is used as a sensor output at the time of a large current, and therefore detection may be performed with high accuracy at the time of the small current while the measurement range is widened, and space saving may be achieved as well.

Hereinafter, embodiments of the invention will be described in detail with the accompanying drawings.

First Embodiment

FIG. 1 is a drawing showing a current sensor according to a first embodiment of the invention.

In the present embodiment, a current sensor 1 shown in FIG. 1 is disposed in the vicinity of a current line in which a current to be measured flows. The current sensor 1 includes a shunt resistor 11 that is connected in series with a current line, a magnetic balance sensor 12 that is disposed in the shunt resistor 11 through an insulating member 14, and a control unit 13 (see FIG. 2) that controls the shunt resistor 11 and the magnetic balance sensor 12. The shunt resistor 11 has a large cross-section, and therefore a resistance value is set as being low so that the current sensor 1 may measure a large current. The shunt resistor 11 is formed in a plate shape, and is integrally formed with the magnetic balance sensor 12 through the insulating member 14 attached to a plate surface. In this case, the magnetic balance sensor 12 detects the current to be measured flowing in the shunt resistor 11 by a generated magnetic field, and therefore measurement may be performed without contact.

Figure 2:
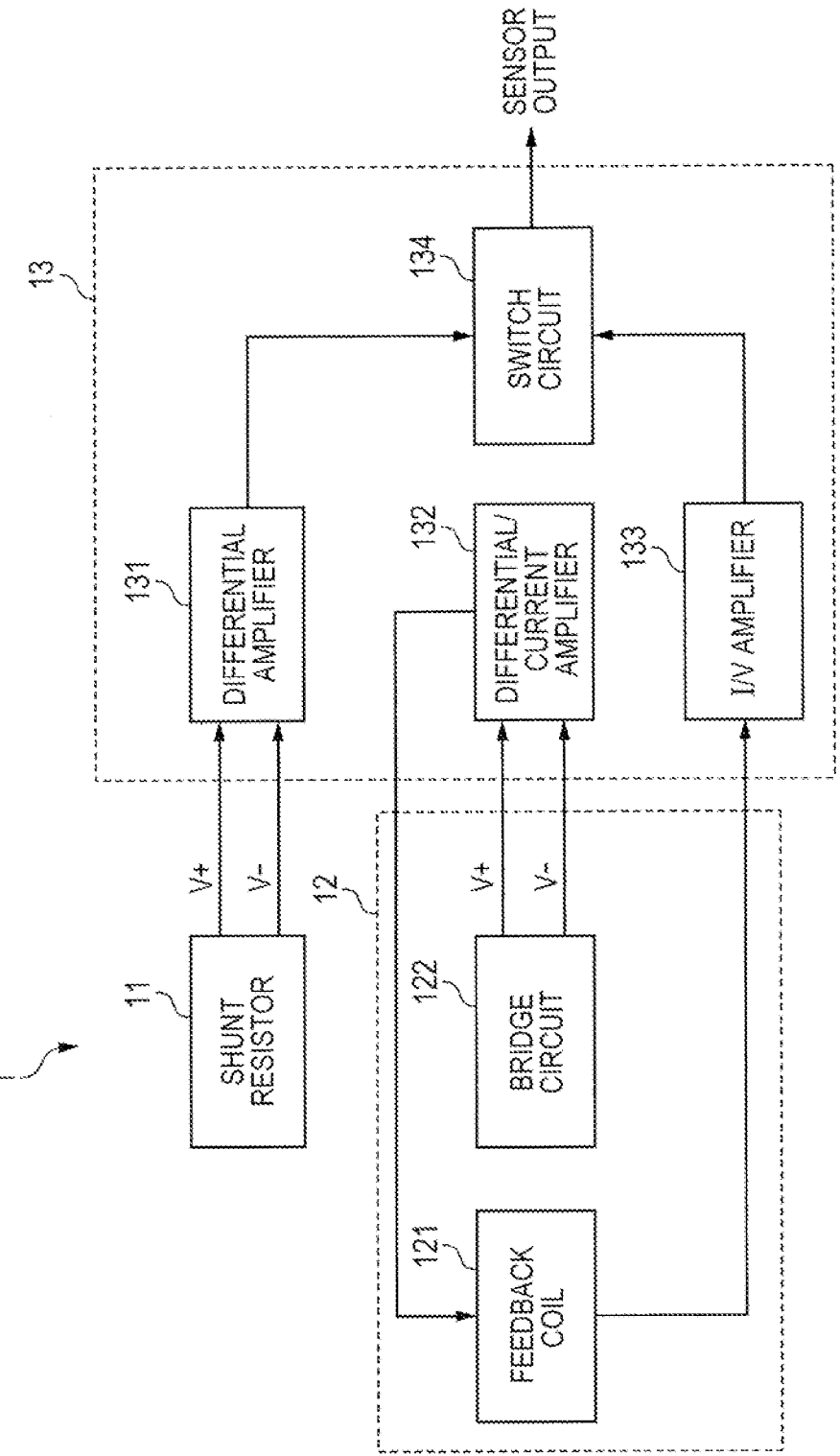
FIG. 2 is a block diagram showing a current sensor according to a first embodiment of the present invention.

FIG. 2 is a block diagram showing a current sensor according to a first embodiment of the present invention. The magnetic balance sensor 12 includes a feedback coil 121 that is disposed in such a manner that a magnetic field for canceling a magnetic field generated by the current to be measured is generated, and a bridge circuit 122 having a magnetoresistance effect element that is a magnetic detecting element. The control unit 13 includes a differential amplifier 131 for amplifying a differential output of the shunt resistor 11, a differential/current amplifier 132 for amplifying a differential output of the bridge circuit 122 to thereby control a feedback current of the feedback coil 121, an I/V amplifier 133 for converting the feedback current of the magnetic balance sensor 12 into a voltage, and a switch circuit 134 for switching shunt resistance detection and magnetic balance detection.

The feedback coil 121 is disposed in the vicinity of the magnetoresistance effect element of the bridge circuit 122, and generates a cancellation magnetic field for offsetting an induced magnetic field generated by the current to be measured. As examples of the magnetoresistance effect element of the bridge circuit 122, a giant magnetoresistance (GMR) element, a tunnel magnetoresistance (TMR) element, or the like may be given. In the magnetoresistance effect element, a resistance value is changed by application of the induced magnetic field from the current to be measured. In addition, using the magnetoresistance effect element, a sensitivity axis may be easily disposed in a direction parallel to a substrate surface on which the current sensor is provided, and a planar coil may be used.

The bridge circuit 122 includes two outputs that produce a voltage difference corresponding to the induced magnetic field generated by the current to be measured. The two outputs of the bridge circuit 122 are amplified by the differential/current amplifier 132. In a case of a mode (balance mode) of the magnetic balance detection, the amplified outputs are provided to the feedback coil 121 as a current (a feedback current). The feedback current corresponds to a voltage difference corresponding to the induced magnetic field. In this instance, in the feedback coil 121, a cancellation magnetic field for offsetting the induced magnetic field is generated. A current flowing in the feedback coil 121 when a balance state in which the induced magnetic field and the cancellation magnetic field are offset is obtained is converted into a voltage in the I/V amplifier 133, and the obtained voltage becomes a sensor output.

In addition, in the differential/current amplifier 132, by setting a power supply voltage as a value close to a reference voltage of I/V conversion+(a maximum within the rating of feedback coil resistance×feedback coil current at the time of full scale), and therefore the feedback current may be automatically limited, thereby protecting the magnetoresistance effect element and the feedback coil. In addition, here, a difference of the two outputs of the bridge circuit 122 is amplified to be used in the feedback current, but only a midpoint potential is used as an output from the bridge circuit, and may be used as the feedback current based on a potential difference with predetermined reference potential.

The switch circuit 134 switches the shunt resistance detection in which a voltage difference from the differential amplifier 131 is used as a sensor output and the magnetic balance detection in which a voltage converted by the I/V amplifier 133 is used as a sensor output. In this manner, the switch circuit 134 produces a magnetic field (cancellation magnetic field) for canceling the induced magnetic field generated by the current to be measured flowing in the current line (shunt resistor 11), and performs circuit control so that the cancellation magnetic field is not produced in the time of shunt resistant mode. That is, the switch circuit 134 switches of the feedback current of the magnetic balance detection mode ON/OFF.

As described above, in the magnetic balance sensor 12 when the current to be measured is large, an output is saturated since there is an upper limit of a current continuously flowing in the feedback coil 121 due to a shortage or the like of a power supply voltage, and therefore a measurement range of the current to be measured becomes narrower. In addition, in the shunt resistor 11, an output voltage at the time of the small current to be measured is significantly small due to a resistance value that is set as being small, and therefore measurement accuracy may be reduced. Accordingly, in order to widen the measurement range and improve the measurement accuracy at the time of measuring a small current, it is preferable that the magnetic balance detection be used in an area of a relatively small current to be measured, and the shunt resistance detection be used in an area of a relatively large current to be measured.

Therefore, the switch circuit 134 switches the magnetic balance detection and the shunt resistance detection (switches a mode) by determining a threshold value with respect to the current to be measured. Specifically, the magnetic balance detection is performed on a side of a small current to be measured, and the shunt resistance detection is performed on a side of a current to be measured larger than the small current to be measured. Here, with reference to FIG. 3, the threshold value of the current to be measured will be described.

Figure 3:
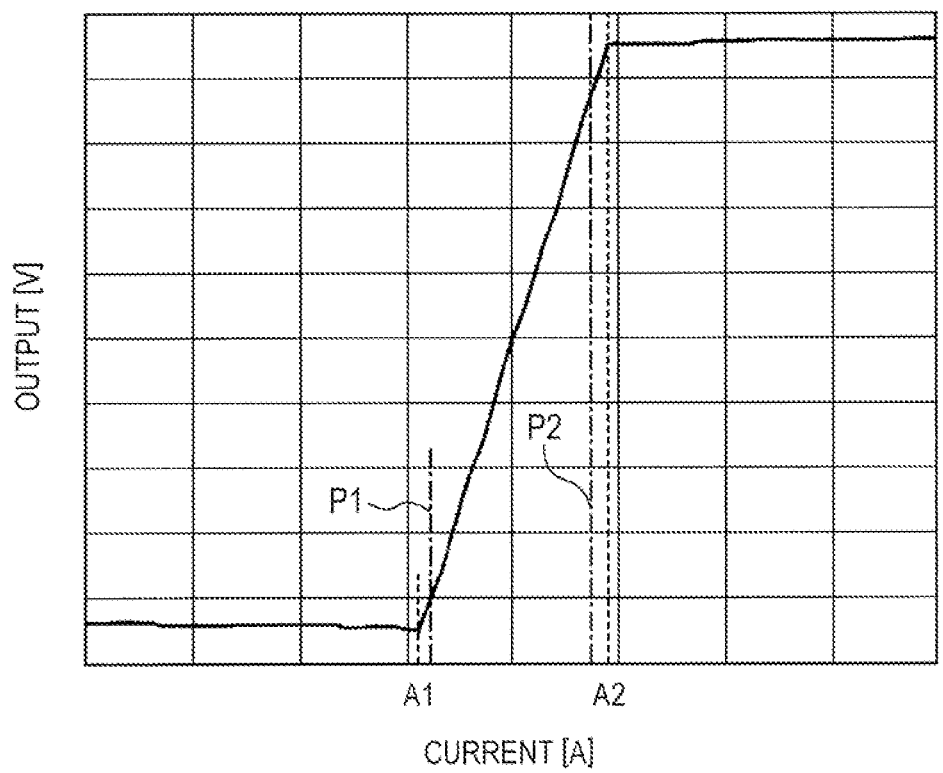
FIG. 3 is an explanatory drawing showing a threshold value of a current to be measured according to a first embodiment of the invention.

As shown in FIG. 3, output characteristics of the magnetic balance sensor 12 are constant in A1 or less, are linearly changed from A1 to A2, and are constant in A2 or more again. By the changes in the output characteristics, it is preferable that threshold values P1 and P2 of the current to be measured be set in such a manner that the magnetic balance detection is used within a range in which linearity is maintained. In addition, it is preferable that the threshold values P1 and P2 be set as a range in which noise becomes a problem in the shunt resistance detection, within a range in which the linearity is maintained. In addition, the threshold values P1 and P2 may be set within a range in which linearity of the output characteristics of the magnetic balance sensor 12 is obtained, and may be set as an upper limit and a lower limit of the range in which the linearity is obtained.

In addition, the linearity of the output characteristics of the magnetic sensor may be obtained due to characteristics of the magnetoresistance effect element or a distance between the magnetoresistance effect element and the feedback coil 121, and therefore the threshold value may be appropriately set according to these factors. In addition, as to a threshold value for switching from the magnetic balance detection to the shunt resistance detection, hysteresis may be provided in order to avoid frequent switching.

In addition, the switch circuit 134 may switch the magnetic balance detection and the shunt resistance detection by an external signal. By doing this, power consumption of the current sensor may be suppressed at the timing when a user wishes to save power such as a sleep mode, or the like. In this case, a mode signal is input to the switch circuit 134 from the outside.

In addition, when mode conversion is automatically carried out, the switch circuit 134 may be configured in such a manner that information (signal shows that whether the magnetic balance detection state or a shunt resistance detection state is obtained), as to which mode the current to be measured is measured in, is output to the outside. Therefore, the mode which the current sensor is in may be determined. In this case, the switch circuit 134 may be connectable to an external monitor. In addition, when the mode conversion is automatically carried out in the switch circuit 134, determination of the threshold value is performed with respect to the current to be measured, and the mode conversion may be carried out based on a result of the determination, or the mode conversion may be carried out based on information from a device in which the current sensor is mounted.

Figure 4A:
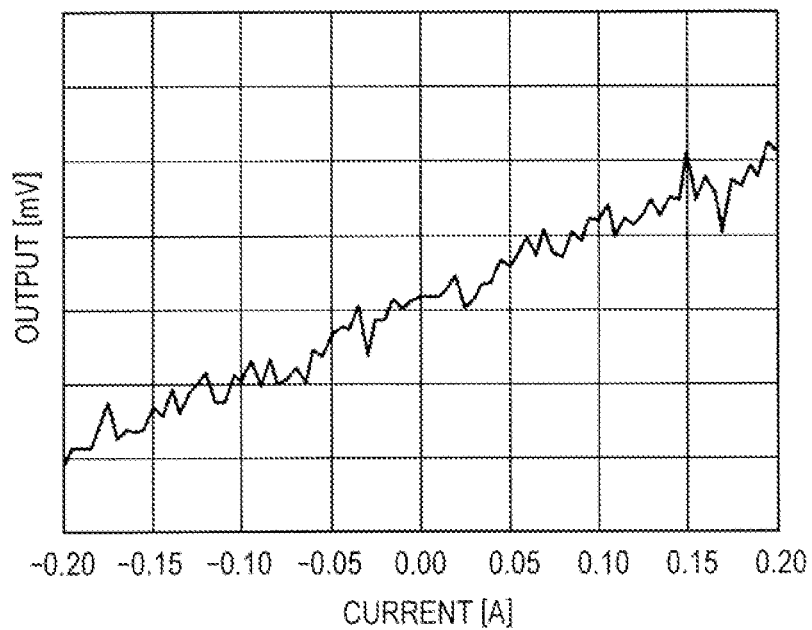
FIGS. 4A and 4B are explanatory drawings showing a measurement result in a magnetic balance type according to a first embodiment of the invention.
Figure 4B:
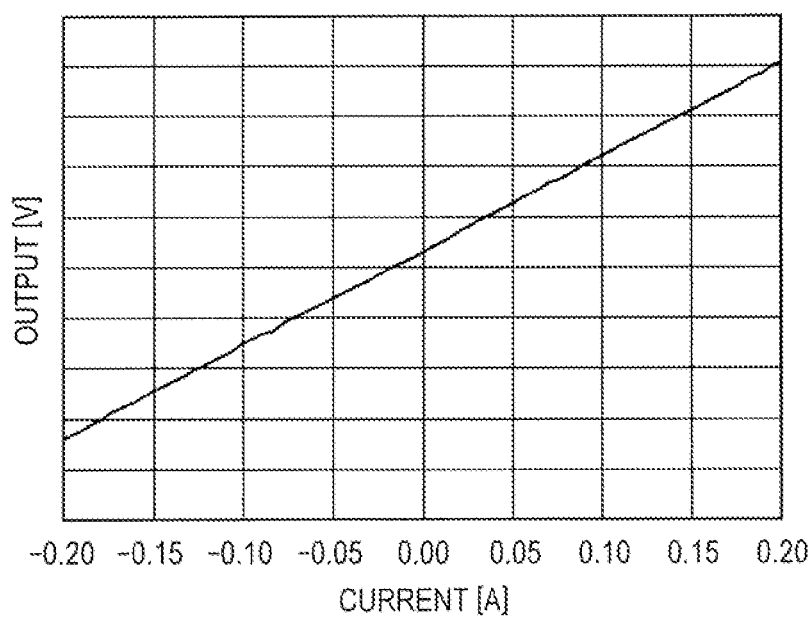

Here, using the current sensor of the invention, the magnetic balance detection and the shunt resistance detection will be described. Here, in each of the times of measuring a small current and the times of measuring a large current, the magnetic balance detection and the shunt resistance detection will be described while comparing measurement results therebetween. First, measurement at the time of a small current will be described. FIG. 4A is a comparative example, and shows a case in which a small current is measured in the shunt resistant type. FIG. 4B is an example of the invention, and shows a case in which a small current is measured in the magnetic balance type.

As shown in the comparative example of FIG. 4A, when a small current within ±1 A (for example, within ±0.20 A) is measured in the shunt resistant type, an error is caused in a resolution of about 50 mA showing a trend of a linear output. This is because a resistance value of the shunt resistor 11 is set as being small in order to measure a large current. Accordingly, when performing measurement in the shunt resistant type in an area of the small current, sufficient measurement accuracy may not be obtained due to noise. Meanwhile, as shown in the example of the invention of FIG. 4B, when a small current within ±1 A (for example, within ±0.20 A) is measured in the magnetic balance type, linear output characteristics may be obtained even in the resolution of 1 mA or less. Accordingly, when performing measurement in the magnetic balance type in the area of the small current, sufficient measurement accuracy may be obtained.

Figure 5A:
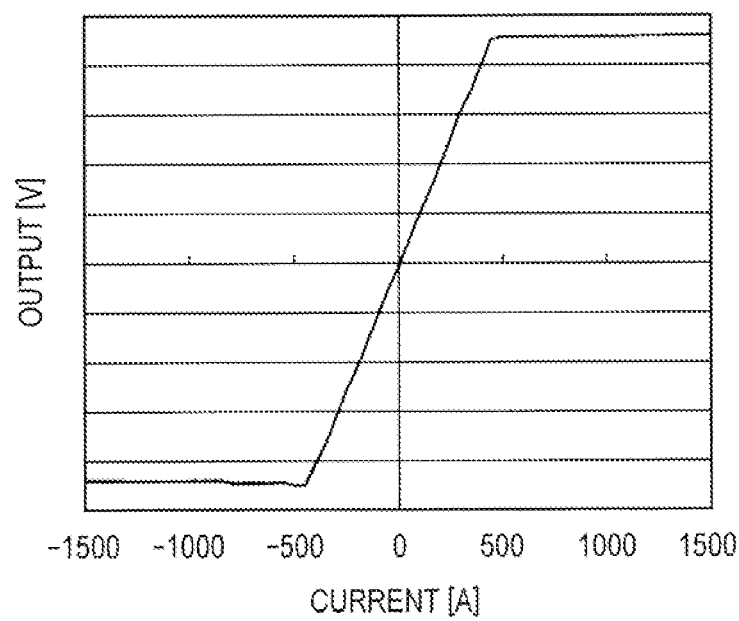
FIGS. 5A and 5B are explanatory drawings showing a measurement result in a shunt resistance type according to the first embodiment of the invention.
Figure 5B:
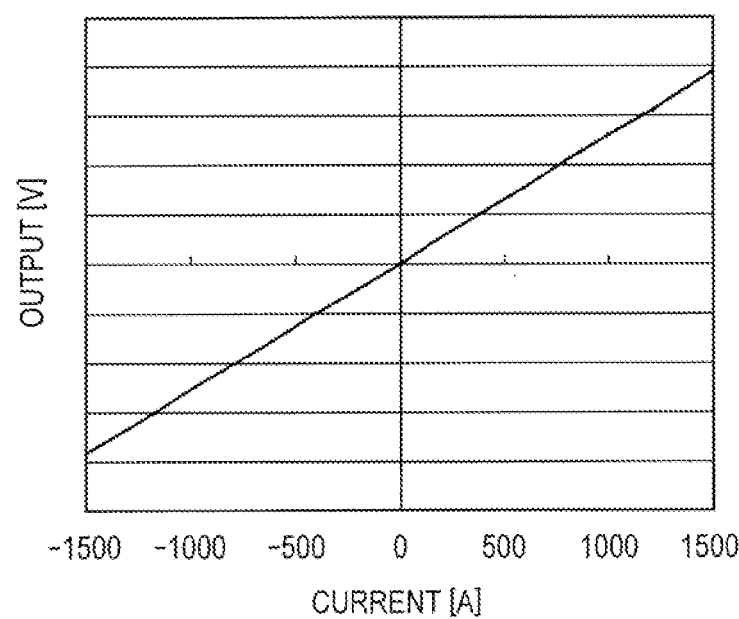

Next, measurement at the time of a large current will be described. FIG. 5A is a comparative example, and shows a case in which a large current is measured in the magnetic balance type. FIG. 5B is an example of the invention, and shows a case in which a large current is measured in the shunt resistant type.

As shown in the comparative example of FIG. 5A, when a current within a range of ±1500 A is measured in the magnetic balance type, linearity deteriorates by ±500 A or more. This is because the magnetic balance sensor has an upper limit of a current continuously flowing in the feedback coil 121 by various conditions such as a power supply voltage or the like. Accordingly, when measurement is performed in the magnetic balance type in a large current area, a dynamic range may not be widened. Meanwhile, as shown in the example of the invention of FIG. 5B, when a current within a range of ±1500 A is measured in the shunt resistant type, linearity is maintained even at about ±1500 A. Accordingly, when performing measurement in the shunt resistant type in the large current area, the dynamic range may be widened.

Accordingly, in the first embodiment, a measurement method may be switched so that in the small current area in which sufficient measurement accuracy may not be obtained in the shunt resistant type, measurement is performed in the magnetic balance type, and measurement is performed in the shunt resistant type in the large current area other than the small current area. Therefore, measurement accuracy at the time of a small current may be improved while widening the measurement range. In addition, in a single current sensor 1, the magnetic balance detection and the shunt resistance detection may be switched, and therefore space saving may be achieved.

Second Embodiment

Next, a second embodiment of the invention will be described. The second embodiment is different from the above-described first embodiment only in that the magnetic proportional sensor instead of the magnetic balance sensor is used. Accordingly, only the difference therebetween will be described.

Figure 6:
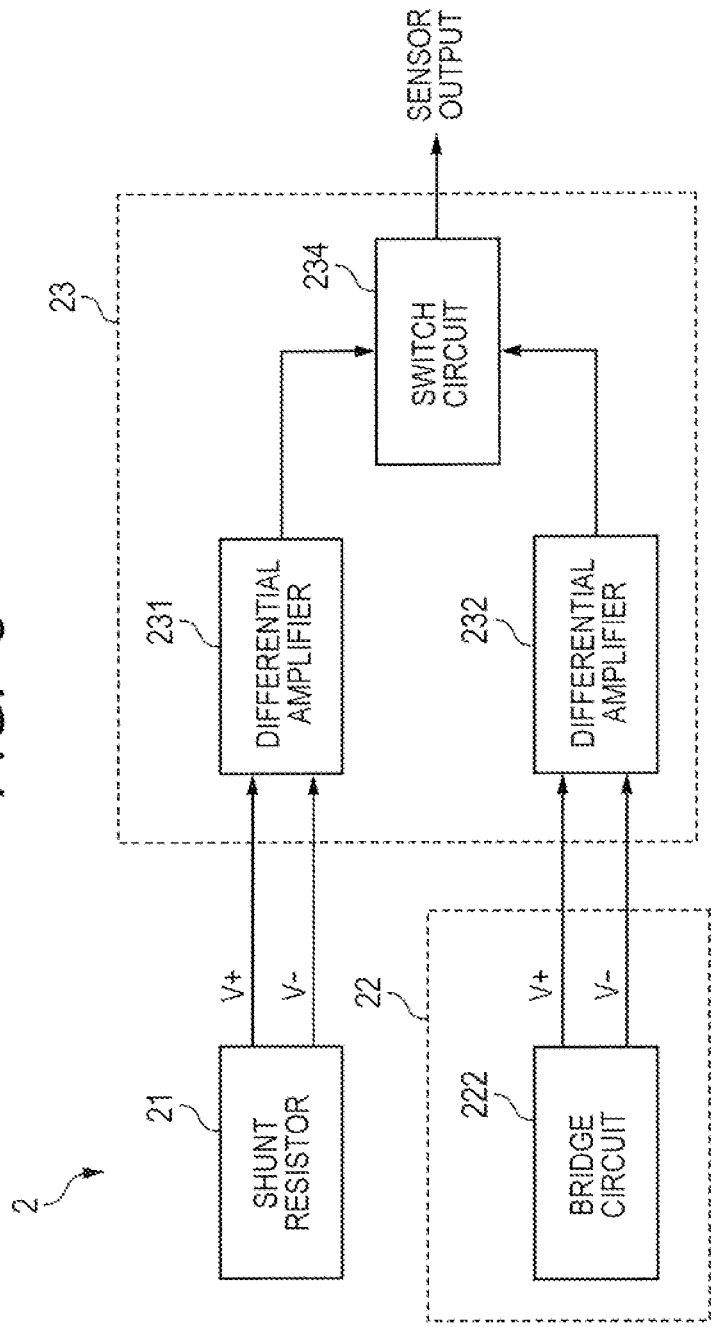
FIG. 6 is a block diagram showing a current sensor according to a second embodiment of the invention.

FIG. 6 is a block diagram showing a current sensor according to a second embodiment of the invention. The current sensor 2 includes a shunt resistor 21 that is connected in series with a current line, a magnetic proportional sensor 22 that is disposed in the shunt resistor 21 through an insulating substrate, and a control unit 23 that controls the shunt resistor 21 and the magnetic proportional sensor 22. The magnetic proportional sensor 22 includes a bridge circuit 222 having two magnetoresistance effect elements which are magnetic detecting elements and two fixed elements. The control unit 23 includes a differential amplifier 231 for amplifying a differential output of the shunt resistor 21, a differential amplifier 232 for amplifying a differential output of the bridge circuit 222, and a switch circuit 234 for switching shunt resistance detection and magnetic proportional detection. The switch circuit 234 uses a voltage of the differential amplifier 231 as a sensor output in a shunt resistance detection mode, and uses a voltage of the differential amplifier 232 as a sensor output in a magnetic proportional detection mode.

As described above, when the current to be measured is large, a magnetic core or a magnetic resistance element is magnetically saturated by a magnetic field of the large current to be measured, and an output value thereafter has gone wrong and the magnetic proportional sensor 22 is not available, and a dynamic range of the current to be measured becomes narrower. In addition, in the magnetic proportional sensor 22, when the current to be measured is small, power consumption is reduced compared to other methods such as the shunt resistance detection, the magnetic proportional detection, or the like. Meanwhile, a resistance value in the shunt resistor 21 is set as being small, and therefore measurement accuracy of the small current to be measured may be deteriorated. Accordingly, in order to widen the measurement range, and to reduce power consumption while improving the measurement accuracy at the time of measuring a small current, it is preferable that the magnetic proportional detection be used in an area of a relatively small current to be measured, and the shunt resistance detection be used in an area of a relatively large current to be measured.

Therefore, in the present embodiment, the switch circuit 234 may determine a threshold value with respect to the current to be measured, perform the magnetic proportional detection on a side of the small current to be measured, and perform the shunt resistance detection on a side of the current to be measured larger than the small current. In addition, even in the magnetic proportional sensor, a range in which linearity of the output characteristics is obtained is limited in the same manner as that in the magnetic balance sensor (see FIG. 3), and therefore the threshold value may be set within the range in which linearity is obtained.

In this manner, in the second embodiment, a measurement method may be switched in such a manner that measurement is performed in the magnetic proportional type in the small current area where sufficient measurement accuracy may not be obtained in the shunt resistant type, and measurement is performed in the shunt resistant type in the large current area other than the small current area. Accordingly, measurement accuracy at the time of the small current may be improved while widening the measurement range. In addition, in the second embodiment, the magnetic proportional detection is used in the small current area, and therefore power consumption may be reduced compared to the first embodiment. In addition, in a single current sensor 1, the magnetic balance detection and the shunt resistance detection may be switched, and therefore space saving may be achieved.

In addition, the current sensor according to the first and second embodiments of the invention may be applied to a device having a large current mode and a small current mode at the time of operation, and may be applied to, for example, a battery current sensor of an electric vehicle or a hybrid car.

For example, when driving a motor during driving, a current of about several hundreds of A flows from a battery. In this case, current detection of the shunt resistant type according to the above-described embodiment may be performed. In addition, when stopping or parking a vehicle, a self-discharge of 1 A or less or a dark current is obtained while a current rarely flows. In this case, the current detection of the magnetic balance type according to the above-described embodiment may be performed. Accordingly, a battery use amount may be detected with high accuracy, and therefore a use range of the battery may be increased, thereby improving a mileage or reducing the battery use amount.

The invention is not limited to the above-described first and second embodiments, and may be changed to thereby be implemented. For example, in the first and second embodiments, a connection relationship, a size, or the like of each element may be appropriately changed to thereby be implemented. In addition, in the above-described embodiments, a case in which the magnetoresistance effect element is used in the magnetic balance current sensor has been described, but a Hall element or other magnetic detecting elements may be used in the magnetic balance current sensor. In addition, the invention may be appropriately changed to be carried out without departing from the scope of the invention.

The invention may be applied to a current sensor that detects a current for driving a motor of an electric vehicle or a hybrid car or charge and discharge of a battery.

It should be understood by those skilled in the art that various modifications, combinations, sub-combinations and alterations may occur depending on design requirements and other factors insofar as they are within the scope of the appended claims of the equivalents thereof.

What is claimed is:

1. A current sensor comprising:
   a magnetic sensor configured to change characteristics thereof by an induced magnetic field applied thereto from a current to be measured flowing through a current line;
   a shunt resistor connected in series to the current line; and
   a switching unit configured to switch to magnetic detection if the current to be measured is smaller than a predetermined current value such that the current sensor outputs an output voltage of the magnetic sensor as a sensor output, and to shunt resistance detection if the current to be measured is equal to or greater than the predetermined current value such that the current sensor outputs a voltage difference of the shunt resistor as the sensor output.

2. The current sensor according to claim 1, wherein in the switching unit, the predetermined current value is a threshold value for output characteristics of the magnetic sensor to maintain linearity thereof.

3. The current sensor according to claim 1, wherein the magnetic sensor is provided on the shunt resistor with an insulating substrate interposed therebetween.

4. The current sensor according to claim 1, wherein the magnetic sensor is a magnetic balance sensor including:
   a magnetic sensor element whose characteristics are changed by the induced magnetic field applied from the current to be measured; and
   a feedback coil disposed in a vicinity of the magnetic sensor element, the feedback coil generating a cancellation magnetic field for cancelling the induced magnetic field.

5. The current sensor according to claim 1, wherein the magnetic sensor is a magnetic proportional sensor including a magnetic sensor element whose characteristics change proportionally to the induced magnetic field applied from the current to be measured.

* * * * *